(12) United States Patent
Wang et al.

(10) Patent No.: US 12,193,273 B2
(45) Date of Patent: Jan. 7, 2025

(54) METHOD FOR FABRICATING DISPLAYING BACKPLANE, DISPLAYING BACKPLANE AND DISPLAYING DEVICE

(71) Applicant: BOE Technology Group Co., Ltd., Beijing (CN)

(72) Inventors: Jing Wang, Beijing (CN); Hongwei Tian, Beijing (CN); Ming Liu, Beijing (CN); Jia Zhao, Beijing (CN); Qiuhua Meng, Beijing (CN); Ziang Han, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/512,114

(22) Filed: Nov. 17, 2023

(65) Prior Publication Data
US 2024/0090267 A1 Mar. 14, 2024

Related U.S. Application Data

(62) Division of application No. 17/485,764, filed on Sep. 27, 2021, now Pat. No. 11,864,422.

(30) Foreign Application Priority Data

Feb. 9, 2021 (CN) .......................... 202110180434.4

(51) Int. Cl.
*H10K 59/121* (2023.01)
*H10K 59/122* (2023.01)
(Continued)

(52) U.S. Cl.
CPC ....... *H10K 59/1213* (2023.02); *H10K 59/122* (2023.02); *H10K 59/124* (2023.02);
(Continued)

(58) Field of Classification Search
CPC ........... H01L 21/02565; H01L 27/1225; H01L 27/127; H01L 29/66969; H01L 29/7869; H01L 29/78696; H10K 59/1213
See application file for complete search history.

(56) References Cited

U.S. PATENT DOCUMENTS 11,864,422 B2 * 1/2024 Wang .................... H10K 71/00
2013/0248850 A1 9/2013 Choi et al.
(Continued)

FOREIGN PATENT DOCUMENTS

CN 103887344 A 6/2014
CN 106971944 A 7/2017
(Continued)

OTHER PUBLICATIONS

Restriction Requirement in the U.S. Appl. No. 17/485,764, dated Jul. 13, 2023.
(Continued)

*Primary Examiner* — Victoria K. Hall
(74) *Attorney, Agent, or Firm* — Intellectual Valley Law, P.C.

(57) ABSTRACT

The present disclosure provides a displaying backplane and a displaying device, and relates to the technical field of displaying. The displaying backplane includes: a substrate base plate; a first active layer and a second active layer that are provided on the substrate base plate, wherein the material of the first active layer and the second active layer is an oxide semiconductor, the first active layer has a first channel region and first no-channel regions, and the second active layer has a second channel region and second no-channel regions; a first grid insulating layer covering the first active layer and the second active layer; and a first grid and a second grid that are provided on the first grid insulating layer; wherein the oxygen-vacancy concentration of the first channel region is greater than the oxygen-vacancy concentrations of the first no-channel regions, the second no-channel regions and the second channel region.

6 Claims, 6 Drawing Sheets

(51) Int. Cl.
  *H10K 59/124* (2023.01)
  *H10K 71/00* (2023.01)
  *H01L 21/02* (2006.01)
  *H01L 27/12* (2006.01)
  *H01L 29/66* (2006.01)
  *H01L 29/786* (2006.01)
  *H10K 59/12* (2023.01)

(52) U.S. Cl.
  CPC ........ *H10K 71/00* (2023.02); *H01L 21/02565* (2013.01); *H01L 27/1225* (2013.01); *H01L 27/1248* (2013.01); *H01L 27/127* (2013.01); *H01L 29/66969* (2013.01); *H01L 29/7869* (2013.01); *H01L 29/78696* (2013.01); *H10K 59/1201* (2023.02)

(56) References Cited

U.S. PATENT DOCUMENTS

| | | | |
|---|---|---|---|
| 2013/0320329 A1* | 12/2013 | Yeh | H01L 27/1248 257/43 |
| 2013/0334533 A1 | 12/2013 | Yamazaki | |
| 2016/0204266 A1 | 7/2016 | Seo et al. | |
| 2016/0307932 A1 | 10/2016 | Ge et al. | |
| 2016/0308066 A1 | 10/2016 | Ge et al. | |
| 2017/0141141 A1 | 5/2017 | Ge et al. | |
| 2018/0247833 A1* | 8/2018 | Ning | H01L 27/12 |
| 2019/0326332 A1 | 10/2019 | Li et al. | |
| 2022/0077264 A1 | 3/2022 | Xue et al. | |

FOREIGN PATENT DOCUMENTS

| | | |
|---|---|---|
| CN | 108565212 A | 9/2018 |
| CN | 110061034 A | 7/2019 |
| CN | 110957340 A | 4/2020 |
| CN | 111900195 A | 11/2020 |

OTHER PUBLICATIONS

Notice of Allowance in the U.S. Appl. No. 17/485,764, dated Oct. 4, 2023.

First Office Action in the Chinese Patent Application No. 202110180434.4 dated Mar. 23, 2022; English translation attached.

* cited by examiner

| forming a first active layer and a second active layer on a substrate base plate, wherein a material of the first active layer and the second active layer is an oxide semiconductor, the first active layer has a first channel region and first no-channel regions that are located on two sides of the first channel region, and the second active layer has a second channel region and second no-channel regions that are located on two sides of the second channel region | 101 |
|---|---|

↓

| forming a first grid insulating layer covering the first active layer and the second active layer | 102 |
|---|---|

↓

| forming a first grid on the first grid insulating layer, wherein an orthographic projection of the first grid on the first active layer coincides with the first channel region | 103 |
|---|---|

↓

| performing ion implantation to the first no-channel regions, the second no-channel regions and the second channel region, to reduce oxygen-vacancy concentrations of the first no-channel regions, the second no-channel regions and the second channel region | 104 |
|---|---|

↓

| forming a second grid on the first grid insulating layer, wherein an orthographic projection of the second grid on the second active layer coincides with the second channel region | 105 |
|---|---|

FIG. 1

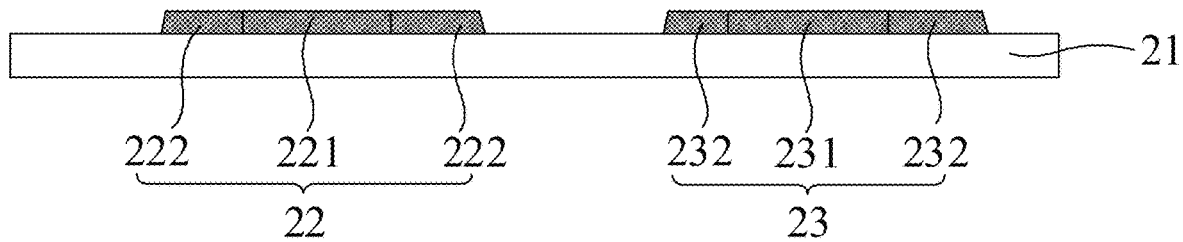

FIG. 2

METHOD FOR FABRICATING DISPLAYING BACKPLANE, DISPLAYING BACKPLANE AND DISPLAYING DEVICE

This is a divisional application of U.S. application Ser. No. 17/485,764, filed on Sep. 27, 2021, which claims benefit of the filing date of Chinese Patent Application No. 202110180434.4 filed on Feb. 9, 2021, now U.S. Pat. No. 11,864,422, issued Jan. 2, 2024, the disclosure of which is hereby incorporated in its entirety by reference.

TECHNICAL FIELD

The present disclosure relates to the technical field of displaying, and particularly relates to a displaying backplane and a displaying device.

BACKGROUND

With the development of the technique of displaying, the sizes of displaying devices are increasing continuously. Correspondingly, the driving frequencies are increasing continuously. The carrier mobilities of conventional amorphous-silicon thin-film transistors cannot satisfy the demands. However, the carrier mobilities of oxide-semiconductor materials such as IGZO (Indium Gallium Zinc Oxide) are 20 times to 30 times that of amorphous silicon, and thin-film transistors using oxide semiconductors as the material of the active layer can greatly increase the speed of charging and discharging of the electrodes, increase the response speed of the pixel, and realize a higher refresh frequency.

SUMMARY

The present disclosure provides a displaying backplane and a displaying device.

The present disclosure discloses a displaying backplane, wherein the displaying backplane comprises:
  a substrate base plate;
  a first active layer and a second active layer that are provided on the substrate base plate, wherein a material of the first active layer and the second active layer is an oxide semiconductor, the first active layer has a first channel region and first no-channel regions that are located on two sides of the first channel region, and the second active layer has a second channel region and second no-channel regions that are located on two sides of the second channel region;
  a first grid insulating layer covering the first active layer and the second active layer; and
  a first grid and a second grid that are provided on the first grid insulating layer, wherein an orthographic projection of the first grid on the first active layer coincides with the first channel region, and an orthographic projection of the second grid on the second active layer coincides with the second channel region;
  wherein an oxygen-vacancy concentration of the first channel region is greater than oxygen-vacancy concentrations of the first no-channel regions, the second no-channel regions and the second channel region.

Optionally, the displaying backplane further comprises a third grid covering the first grid; and
  in a direction along a length of the first channel region, a size of the third grid is greater than or equal to a size of the first grid.

Optionally, each of the first no-channel regions comprises a lightly doped region and a first conductorized region, and the first conductorized region is located on one side of the lightly doped region that is further away from the first channel region; or, the first no-channel regions are second conductorized regions; and
  the second no-channel regions are third conductorized regions.

Optionally, the displaying backplane further comprises:
  a second grid insulating layer covering the second grid and the first grid insulating layer;
  an inter-layer-medium layer provided on the second grid insulating layer;
  a first source, a first drain, a second source and a second drain that are provided on the inter-layer-medium layer, wherein the first source is connected to the first active layer by a first via hole, the first drain is connected to the first active layer by a second via hole, the second source is connected to the second active layer by a third via hole, the second drain is connected to the second active layer by a fourth via hole, and all of the first via hole, the second via hole, the third via hole and the fourth via hole penetrate the inter-layer-medium layer, the second grid insulating layer and the first grid insulating layer;
  a planarization layer covering the first source, the first drain, the second source, the second drain and the inter-layer-medium layer;
  an anode layer provided on the planarization layer, wherein the anode layer is connected to the first drain by a fifth via hole penetrating the planarization layer; and
  a pixel defining layer provided on the planarization layer, wherein the pixel defining layer partially covers the anode layer, and the pixel defining layer has a plurality of pixel openings exposing the anode layer.

The present disclosure further discloses a displaying device, wherein the displaying device comprises the displaying backplane stated above.

Optionally, the displaying device further comprises an organic luminescent layer provided within the pixel openings, a cathode layer covering the organic luminescent layer and the displaying backplane, and a packaging layer provided on the cathode layer;
  wherein, the packaging layer is an organic packaging layer, an inorganic packaging layer, or a laminated-layer structure of an organic packaging layer and an inorganic packaging layer.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present application are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

FIG. 1 shows a flow chart of the method for fabricating a displaying backplane according to an embodiment of the present disclosure;

FIG. 2 shows a schematic structural diagram of an embodiment of the present disclosure in which the first active layer and the second active layer have been formed on the substrate base plate;

DETAILED DESCRIPTION

Figure 3:
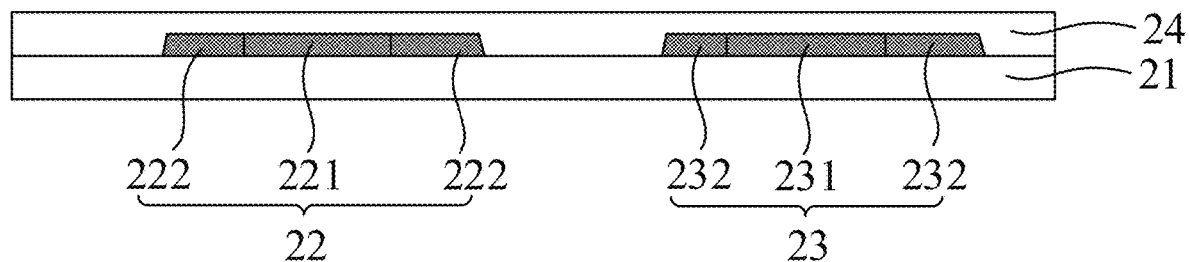
FIG. 3 shows a schematic structural diagram of an embodiment of the present disclosure in which the first grid insulating layer covering the first active layer and the second active layer has been formed.

In order to make the above purposes, features and advantages of the present disclosure more apparent and understandable, the present disclosure will be described in further detail below with reference to the drawings and the particular embodiments.

In the related art, the fabrication of a displaying backplane comprises, firstly, forming a first active layer and a second active layer on a substrate base plate, wherein the materials of the first active layer and the second active layer are oxide semiconductors; subsequently, forming a grid insulating layer covering the first active layer and the second active layer; subsequently, forming a first grid and a second grid at the same time on the grid insulating layer; and finally, forming the film layers such as an inter-layer-medium layer and the source/drain, to obtain the displaying backplane.

The first active layer is the active layer of the driver transistor, and the second active layer is the active layer of the switching transistor. When the first active layer and the second active layer are formed by using a magnetron-sputtering process, both of the first active layer and the second active layer have a high concentration of oxygen vacancies. However, regarding the switching transistor, when the oxygen-vacancy concentration of the active layer is relatively high, its leakage current correspondingly increases, which results in the increase of the power consumption of the displaying backplane.

However, in the embodiments of the present disclosure, by, after the first grid has been formed, performing ion implantation to the first no-channel regions, the second no-channel regions and the second channel region, to occupy the oxygen vacancies of the first no-channel regions, the second no-channel regions and the second channel region, the oxygen-vacancy concentrations of the first no-channel regions, the second no-channel regions and the second channel region are reduced. At this point, the oxygen-vacancy concentration of the first channel region is still relatively high, whereby the carrier mobility of the driver transistor is still relatively high, while the oxygen-vacancy concentration of the second channel region of the switching transistor is reduced, which can reduce the leakage current of the switching transistor, thereby reducing the power consumption of the displaying backplane.

Referring to FIG. 1, FIG. 1 shows a flow chart of the method for fabricating a displaying backplane according to an embodiment of the present disclosure, which may particularly comprise the following steps:

Step 101: forming a first active layer and a second active layer on a substrate base plate, wherein a material of the first active layer and the second active layer is an oxide semiconductor, the first active layer has a first channel region and first no-channel regions that are located on two sides of the first channel region, and the second active layer has a second channel region and second no-channel regions that are located on two sides of the second channel region.

In an embodiment of the present disclosure, as shown in FIG. 2, the substrate base plate 21 may be a rigid base plate, such as a glass base plate, and the substrate base plate 21 may also be a flexible base plate, such as a PI (Polyimide) base plate.

After the substrate base plate 21 has been obtained, a first active layer 22 and a second active layer 23 are formed on the substrate base plate 21 by using a one-step patterning process. Particularly, the process may comprise, firstly, forming an active-layer thin film on the substrate base plate 21 by using a sputtering process, subsequently spread-coating a photoresist on the active-layer thin film, performing exposure and development to the photoresist, etching the active-layer thin film within the photoresist-removed region, and finally stripping the residual photoresist, to obtain the first active layer 22 and the second active layer 23, at which point, all of the regions of the first active layer 22 and the second active layer 23 have a high concentration of oxygen vacancies.

It should be noted that an oxygen vacancy refers to, in a metal oxide or other oxygen-containing compounds, a vacancy that is formed by oxygen deficiency caused by leaving of an oxygen atom (oxygen ion) in a crystal lattice.

The materials of the first active layer 22 and the second active layer 23 are the same, both of which are an oxide semiconductor. For example, both of the materials of the first active layer 22 and the second active layer 23 are IGZO.

Moreover, according to the position relation between the first active layer 22 and the subsequently formed film layers, the first active layer is delimited into a first channel region 221 and first no-channel regions 222 that are located on the two sides of the first channel region 221. Correspondingly, according to the position relation between the second active layer 23 and the subsequently formed film layers, the second active layer 23 is delimited into a second channel region 231 and second no-channel regions 232 that are located on the two sides of the second channel region 231.

Furthermore, the first active layer 22 refers to the active layer of the driver transistor in the pixel driving circuit, and the second active layer 23 refers to the active layer of the switching transistor in the pixel driving circuit, wherein the driver transistor refers to the transistor driving the light emitting device to emit light, and the switching transistor refers to the other transistor than the driver transistor in the pixel driving circuit.

Step 102: forming a first grid insulating layer covering the first active layer and the second active layer.

In an embodiment of the present disclosure, after the first active layer 22 and the second active layer 23 have been formed on the substrate base plate 21, as shown in FIG. 3, a first grid insulating layer 24 covering the first active layer 22 and the second active layer 23 is formed, and the first grid insulating layer 24 further covers the substrate base plate 21.

The material of the first grid insulating layer 24 is at least one of silicon nitride and silicon oxide. The first grid insulating layer 24 may be formed by using a depositing process, wherein the depositing process may be a CVD (Chemical vapor deposition) process.

Step 103: forming a first grid on the first grid insulating layer, wherein an orthographic projection of the first grid on the first active layer coincides with the first channel region.

Figure 4:
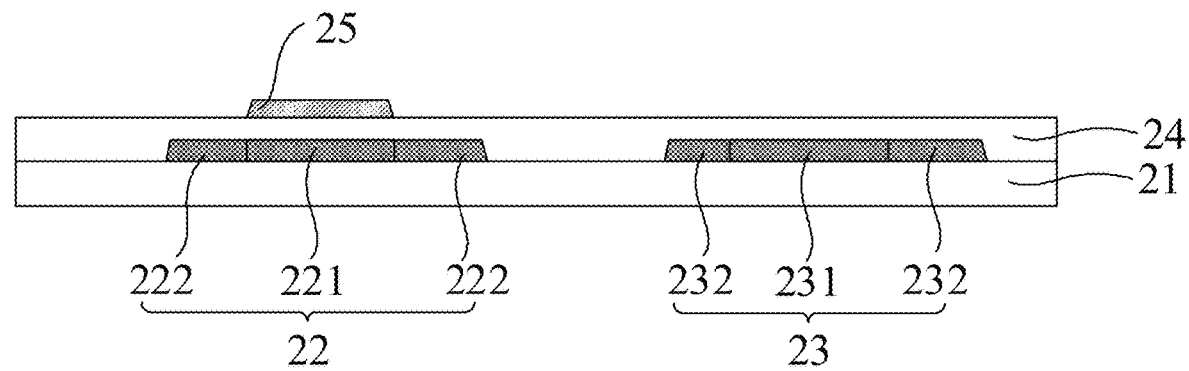
FIG. 4 shows a schematic structural diagram of an embodiment of the present disclosure in which the first grid has been formed on the first grid insulating layer.

In an embodiment of the present disclosure, after the first grid insulating layer 24 covering the first active layer 22 and the second active layer 23 has been formed, as shown in FIG. 4, a first grid 25 is formed on the first grid insulating layer 24 by using a one-step patterning process. Particularly, the process may comprise, firstly, forming a first-grid thin film on the first grid insulating layer 24 by using a sputtering process, subsequently spread-coating a photoresist on the first-grid thin film, performing exposure and development to the photoresist, etching the first-grid thin film within the photoresist-removed region, and finally stripping the residual photoresist, to obtain the first grid 25.

The first grid 25 refers to the grid of the driver transistor. The orthographic projection of the first grid 25 on the first active layer 22 coincides with the first channel region 221. The material of the first grid 25 is at least one of copper, molybdenum, titanium or aluminum.

Step 104: performing ion implantation to the first no-channel regions, the second no-channel regions and the second channel region, to reduce oxygen-vacancy concentrations of the first no-channel regions, the second no-channel regions and the second channel region.

Figure 5:
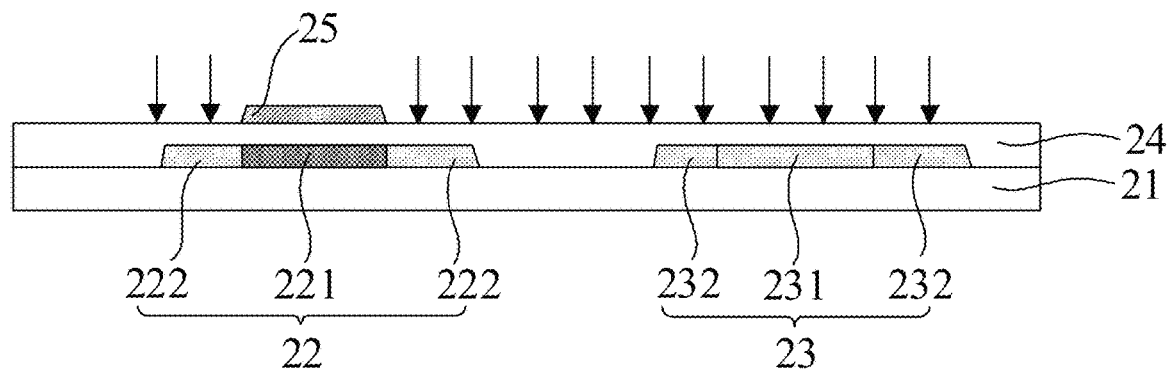
FIG. 5 shows a schematic diagram of the ion implantation into the first no-channel regions, the second no-channel regions and the second channel region according to an embodiment of the present disclosure.

In an embodiment of the present disclosure, after the first grid 25 has been formed on the first grid insulating layer 24, as shown in FIG. 5, ion implantation is performed to the substrate base plate 21 formed with the first grid 25, the first grid insulating layer 24, the first active layer 22 and the second active layer 23. Because the first grid 25 blocks the first channel region 221 of the first active layer 22, for the ion implantation, the ion implantation is performed to the first no-channel regions 222 of the first active layer 22, and the second no-channel regions 232 and the second channel region 231 of the second active layer 23. By the occupation of the oxygen vacancies of the first no-channel regions 222, the second no-channel regions 232 and the second channel region 231 by the implanted ions, the oxygen-vacancy concentrations of the first no-channel regions 222, the second no-channel regions 232 and the second channel region 231 are reduced.

Particularly, the ions used for the ion implantation to the first no-channel regions 222, the second no-channel regions 232 and the second channel region 231 are phosphorus ions.

Regarding the driver transistor, it requires a high carrier mobility. Therefore, by performing ion implantation merely to the first no-channel regions 222 of the first active layer 22, the oxygen-vacancy concentrations of the first no-channel regions 222 are reduced, while the oxygen-vacancy concentration of the first channel region 221 of the first active layer 22 is still relatively high, whereby the carrier mobility of the driver transistor is still relatively high, which can satisfy the demands. However, regarding the switching transistor, it does not require a high carrier mobility. Therefore, the ion implantation is performed to all of the second no-channel regions 232 and the second channel region 231 of the second active layer 23, to reduce the oxygen-vacancy concentrations of the first no-channel regions 222 and the second channel region 231. When the oxygen-vacancy concentrations of all of the regions of the second active layer 23 have been reduced, the leakage current of the switching transistor can be reduced, thereby reducing the power consumption of the displaying backplane.

Step 105: forming a second grid on the first grid insulating layer, wherein an orthographic projection of the second grid on the second active layer coincides with the second channel region.

Figure 6:
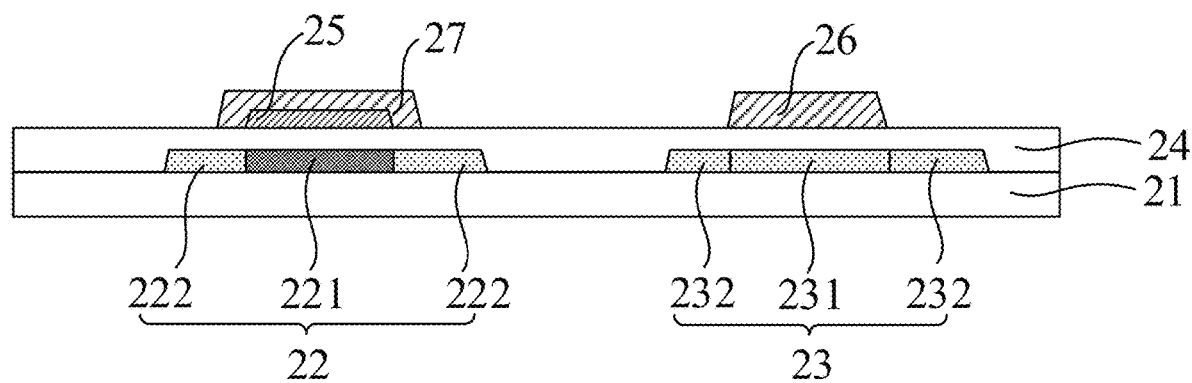
FIG. 6 shows a schematic structural diagram after the second grid and the third grid have been formed on the structure shown in FIG. 5.
Figure 9:
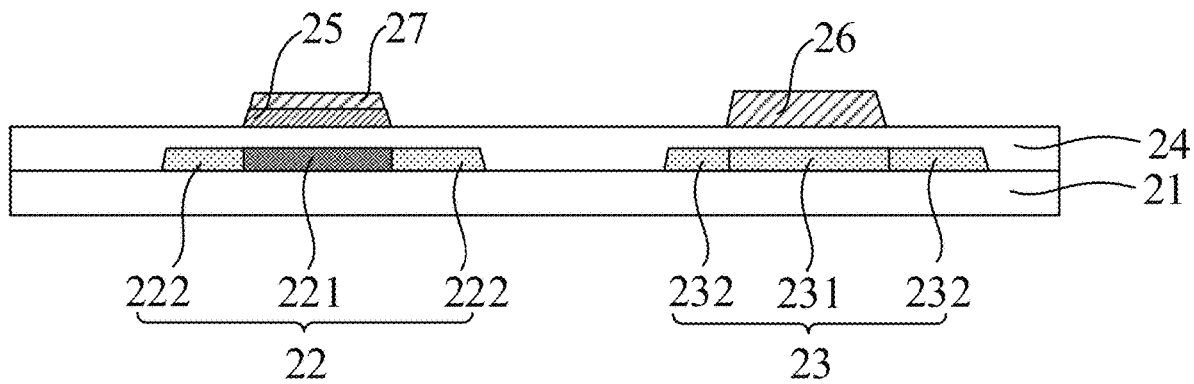
FIG. 9 shows another schematic structural diagram after the second grid and the third grid have been formed on the structure shown in FIG. 5.

In an embodiment of the present disclosure, after the ion implantation has been performed to the first no-channel regions 222, the second no-channel regions 232 and the second channel region 231, as shown in FIGS. 6 and 9, a second grid 26 is formed on the first grid insulating layer 24 by using a patterning process.

The second grid 26 refers to the grid of the switching transistor. The orthographic projection of the second grid 26 on the second active layer 23 coincides with the second channel region 231. The material of the second grid 26 is at least one of copper, molybdenum, titanium or aluminum.

In an optional embodiment of the present disclosure, after the step 104, the method further comprises the step S11: forming a third grid covering the first grid.

After the ion implantation has been performed to the first no-channel regions 222, the second no-channel regions 232 and the second channel region 231, as shown in FIGS. 6 and 9, a third grid 27 covering the first grid 25 may further be formed by using a patterning process. In the direction along the length of the first channel region 221, the size of the third grid 27 is greater than or equal to the size of the first grid 25.

As shown in FIG. 6, in the direction along the length of the first channel region 221, the size of the third grid 27 is greater than the size of the first grid 25. At this point, the third grid 27, besides covering the first grid 25, further covers part of the first grid insulating layer 24, and the orthographic projection of the third grid 27 on the first active layer 22 covers the first channel region 221 and part of the first no-channel regions 222; in other words, the orthographic projection of the third grid 27 on the first active layer 22 is located within the region where the first active layer 22 is located.

In the practical product, the first no-channel regions 222 that are covered by the orthographic projection of the third grid 27 on the first active layer 22 are lightly doped regions. The provision of the lightly doped regions on the two sides of the first channel region 221 is equivalent to connecting in series a large resistor between the source/drain and the first channel region 221 of the driver transistor, which reduces the horizontal electric field of the first channel region 221, thereby reducing the hot carriers generated by collision ionization caused by electric-field acceleration, which effectively inhibits the leakage current of the driver transistor. Furthermore, after the lightly doped regions have been provided, the distance between the source/drain of the driver transistor can be increased suitably, which alleviates the affection by the short-channel effect, and reduces the leakage current of the driver transistor.

As shown in FIG. 9, in the direction along the length of the first channel region 221, the size of the third grid 27 is equal to the size of the first grid 25. At this point, the third grid 27 merely covers the first grid 25, and the orthographic projection of the third grid 27 on the first active layer 22 coincides with the first channel region 221.

Moreover, in the direction along the width of the first channel region 221, the size of the third grid 27 is equal to the size of the first grid 25.

In the actual fabrication process, the second grid 26 and the third grid 27 may be formed individually by using a one-step patterning process. For example, the process may comprise, firstly, forming the second grid 26 by using a one-step patterning process, and subsequently forming the third grid 27 by using another one-step patterning process. Alternatively, the process may also comprise forming the third grid 27 by using a one-step patterning process, and subsequently forming the second grid 26 by using another one-step patterning process. In this case, the materials of the third grid 27 and the second grid 26 may be the same, and may also be different.

Certainly, the third grid 27 and the second grid 26 may also be formed by using the same one patterning process; in other words, the third grid 27 and the second grid 26 are formed at the same time by using a one-step patterning process. In this case, the materials of the third grid 27 and the second grid 26 are the same.

Particularly, after the ion implantation has been performed to the first no-channel regions 222, the second no-channel regions 232 and the second channel region 231, the method may comprise forming a second-grid thin film covering the first grid insulating layer 24 and the first grid 25 by using a sputtering process, subsequently spread-coating a photoresist on the second-grid thin film, performing exposure and development to the photoresist, etching the second-grid thin film within the photoresist-removed region, and finally stripping the residual photoresist, to obtain the third grid 27 and the second grid 26.

Optionally, after the step S11, the method further comprises the step S12: performing conductorization treatment to the first active layer within the region not covered by the third grid and the second active layer within the second no-channel regions.

Figure 7:
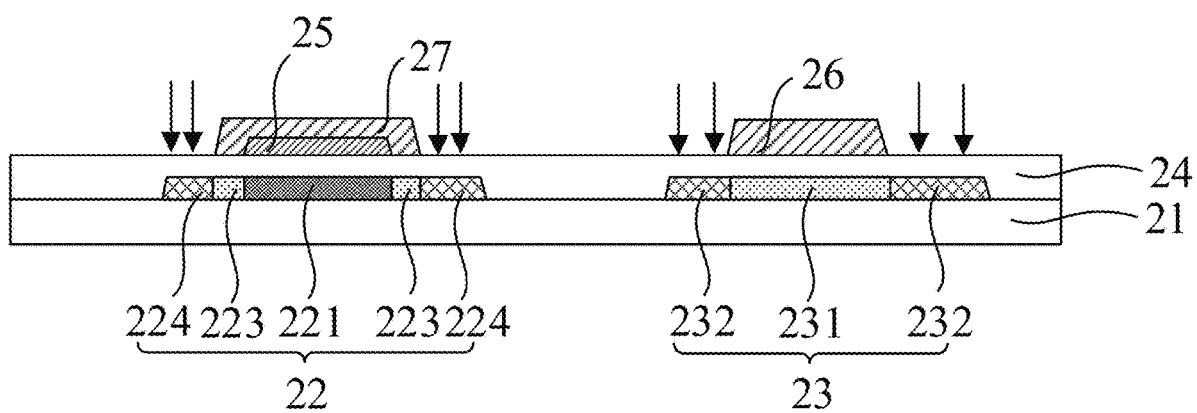
FIG. 7 shows a schematic structural diagram of the conductorization treatment to the first active layer and the second active layer in the structure shown in FIG. 6.
Figure 10:
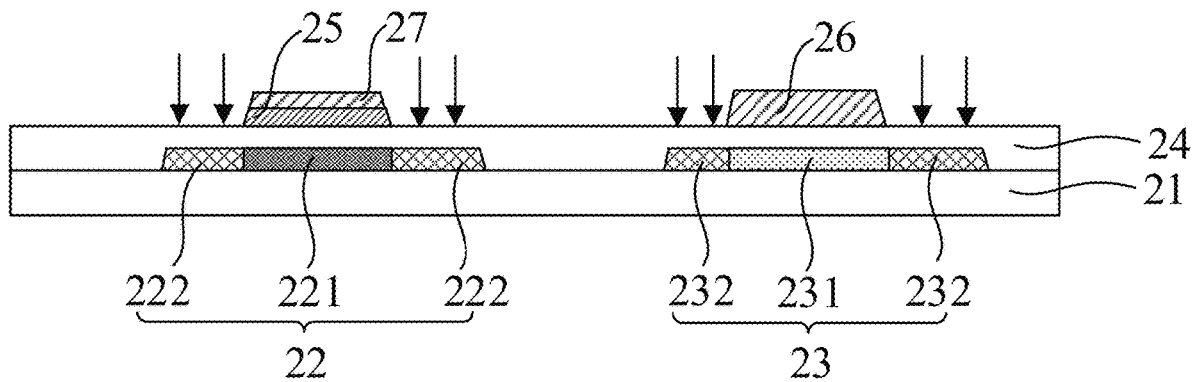
FIG. 10 shows a schematic structural diagram of the conductorization treatment to the first active layer and the second active layer in the structure shown in FIG. 9.

After the second grid 26 and the third grid 27 have been formed, as shown in FIGS. 7 and 10, conductorization treatment is performed to the first active layer 22 at the region not covered by the third grid 27 and the second active layer 23 at the second no-channel regions 232, so that part of or the whole of the first no-channel regions 222 of the first active layer 22 are transformed into a conductorized region, and so that the whole of the second no-channel regions 232 of the second active layer 23 are transformed into a conductorized region. The first active layer 22 at the region not covered by the third grid 27 refers to the active layer corresponding to the positions contacting the source/drain of the driver transistor, and the second active layer 23 at the second no-channel regions 232 refers to the active layer corresponding to the positions contacting the source/drain of the switching transistor.

By performing the conductorization treatment to the first active layer 22 at the region not covered by the third grid 27, the contact resistance between the first active layer 22 and the source/drain of the driver transistor is reduced, and by performing the conductorization treatment to the second active layer 23 at the second no-channel regions 232, the contact resistance between the second active layer 23 and the source/drain of the switching transistor is reduced, thereby improving the electrical characteristics of the driver transistor and the switching transistor.

As shown in FIG. 7, in the direction along the length of the first channel region 221, when the size of the third grid 27 is greater than the size of the first grid 25, because the orthographic projection of the third grid 27 on the first active layer 22 covers part of the first no-channel regions 222, after the conductorization treatment has been performed to the first active layer 22 at the region not covered by the third grid 27, merely part of the first no-channel regions 222 have been transformed into a conductorized region; in other words, each of the first no-channel regions 222 is further delimited into a lightly doped region 223 and a first conductorized region 224, and the first conductorized region 224 is located on the one side of the lightly doped region 223 that is further away from the first channel region 221. The lightly doped region 223 refers to the region of the first no-channel region 222 that is blocked by the third grid 27, and its oxygen-vacancy concentration is reduced merely by the ion implantation. Moreover, the first conductorized region 224 refers to the region of the first no-channel region 222 that is not blocked by the third grid 27, and it does not only have an oxygen-vacancy concentration reduced by the ion implantation, but also has undergone the conductorization treatment.

As shown in FIG. 10, in the direction along the length of the first channel region 221, when the size of the third grid 27 is equal to the size of the first grid 25, because the orthographic projection of the third grid 27 on the first active layer 22 coincides with the first channel region 221, after the conductorization treatment has been performed to the first active layer 22 at the region not covered by the third grid 27, the whole of the first no-channel regions 222 can be transformed into a conductorized region; in other words, the first no-channel regions 222 are a second conductorized region.

Regarding the switching transistor, because it is merely provided with the second grid 26, and the orthographic projection of the second grid 26 on the second active layer 23 coincides with the second channel region 231, after the conductorization treatment has been performed to the second active layer 23 at the second no-channel regions 232, the whole of the second no-channel regions 232 can be transformed into a conductorized region; in other words, the second no-channel regions 232 are a third conductorized region.

Particularly, the conductorization treatment is performed to the first active layer 22 and the second active layer 23 by using an ion implantation process.

If the driver transistor is an N-type transistor, the conductorization treatment is performed to the first active layer 22 at the region not covered by the third grid 27 by doping of phosphorus ions, and if the driver transistor is a P-type transistor, the conductorization treatment is performed to the first active layer 22 at the region not covered by the third grid 27 by doping of boron ions. Correspondingly, if the switching transistor is an N-type transistor, the conductorization treatment is performed to the second active layer 23 at the second no-channel regions 232 by doping of phosphorus ions, and if the switching transistor is a P-type transistor, the conductorization treatment is performed to the second active layer 23 at the second no-channel regions 232 by doping of boron ions.

Optionally, after the step 105, the method further comprises the step S13 to the step S19:

Step S13: forming a second grid insulating layer covering the second grid and the first grid insulating layer;

Step S14: forming an inter-layer-medium layer on the second grid insulating layer;

Step S15: forming a first via hole, a second via hole, a third via hole and a fourth via hole that penetrate the inter-layer-medium layer, the second grid insulating layer and the first grid insulating layer;

Step S16: forming a first source, a first drain, a second source and a second drain on the inter-layer-medium layer, wherein the first source is connected to the first active layer by the first via hole, the first drain is connected to the first active layer by the second via hole, the second source is connected to the second active layer by the third via hole, and the second drain is connected to the second active layer by the fourth via hole;

Step S17: forming a planarization layer covering the first source, the first drain, the second source, the second drain and the inter-layer-medium layer;

Step S18: forming an anode layer on the planarization layer, wherein the anode layer is connected to the first drain by a fifth via hole penetrating the planarization layer; and Step S19: forming a pixel defining layer on the planarization layer, wherein the pixel defining layer partially covers the anode layer, and the pixel defining layer has a plurality of pixel openings exposing the anode layer.

Figure 8A:
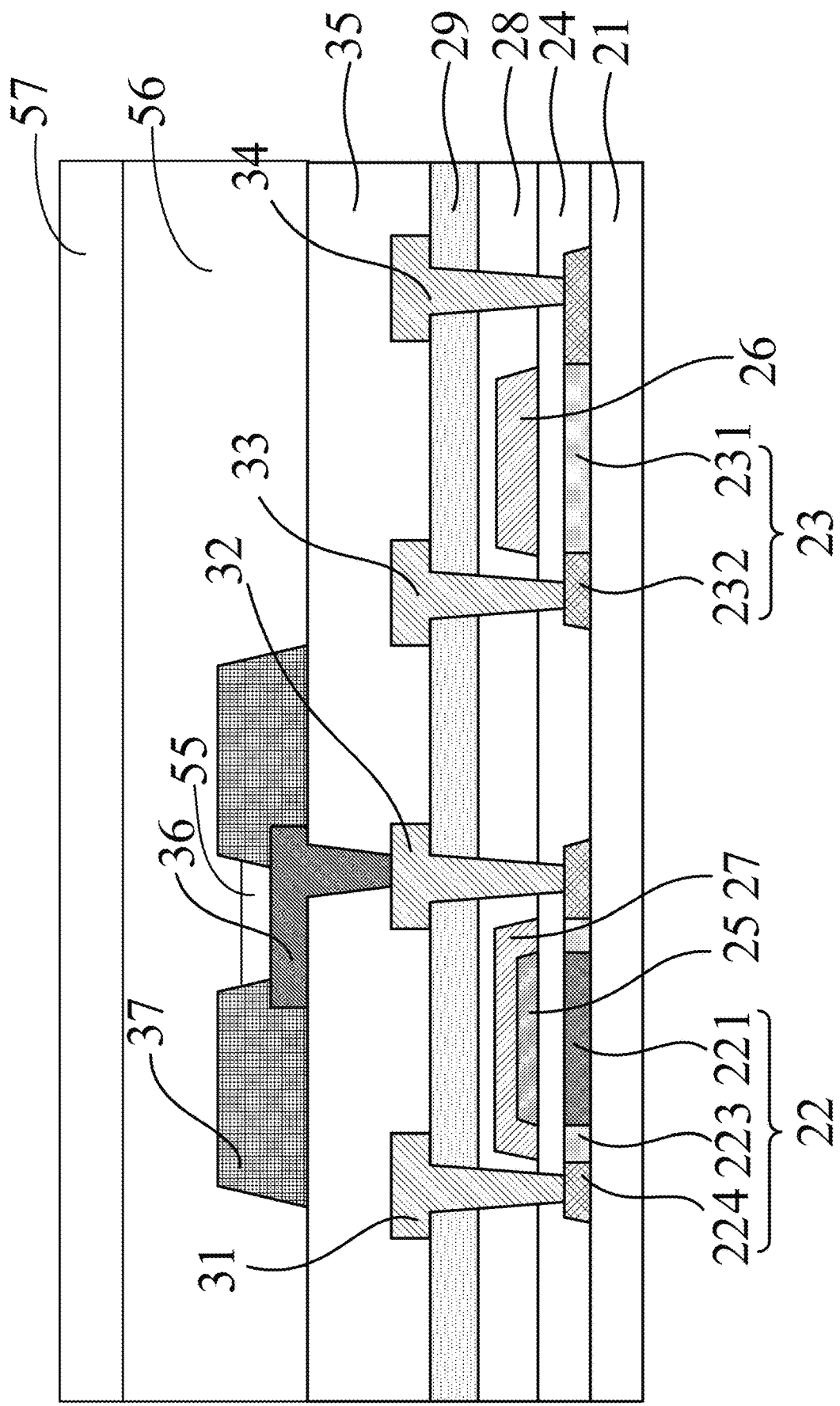
FIG. 8A shows a schematic structural diagram after the second grid insulating layer, the inter-layer-medium layer, the source/drain, the planarization layer, the anode layer and the pixel defining layer have been formed on the structure shown in FIG. 7.
Figure 11:
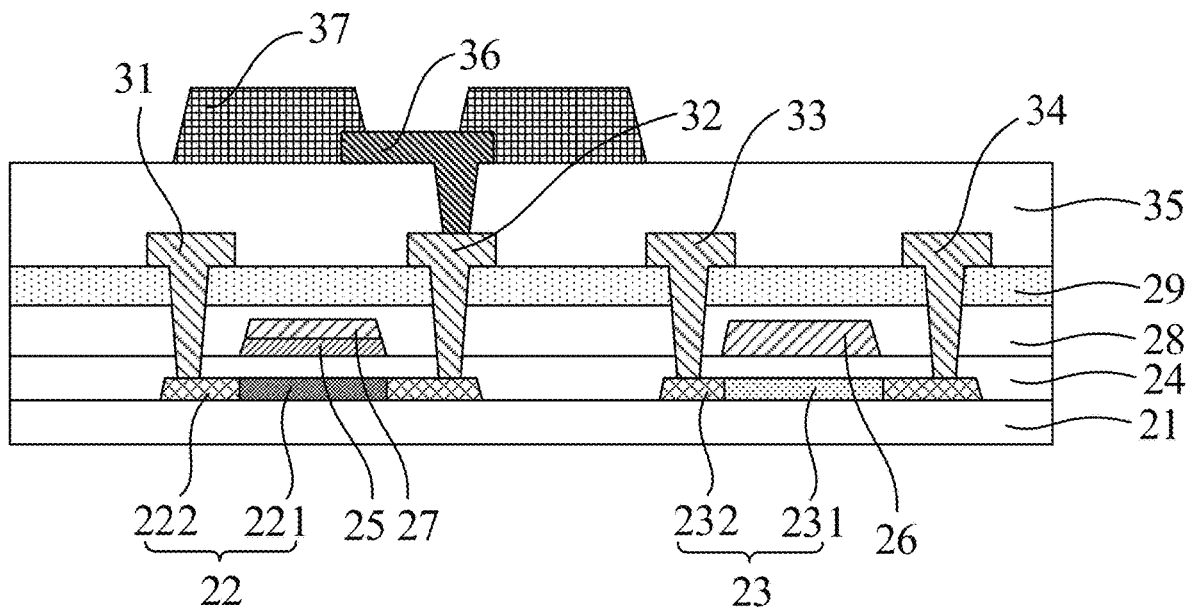
FIG. 11 shows a schematic structural diagram after the second grid insulating layer, the inter-layer-medium layer, the source/drain, the planarization layer, the anode layer and the pixel defining layer have been formed on the structure shown in FIG. 10.

As shown in FIGS. 8A and 11, after the second grid 26 has been formed on the first grid insulating layer 24, or, after the second grid 26 and the third grid 27 have been formed, and the conductorization treatment has been performed to the first active layer 22 at the region not covered by the third grid 27 and the second active layer 23 at the second no-channel regions 232, firstly, a second grid insulating layer 28 is formed by using a depositing process. The material of the second grid insulating layer 28 is at least one of silicon nitride and silicon oxide.

When the driver transistor comprises merely the first grid 25, the second grid insulating layer 28 covers the second grid 26, the first grid 25 and the first grid insulating layer 24. When the driver transistor comprises the first grid 25 and the third grid 27, and the third grid 27 covers the first grid 25, the second grid insulating layer 28 covers the third grid 27, the second grid 26 and the first grid insulating layer 24.

Subsequently, the process comprises forming an inter-layer-medium layer 29 on the second grid insulating layer 28 by using a depositing process, wherein the material of the inter-layer-medium layer 29 is at least one of silicon nitride and silicon oxide; subsequently spread-coating a photoresist on the inter-layer-medium layer 29, performing exposure and development to the photoresist, etching the inter-layer-medium layer within the photoresist-removed region, and finally stripping the residual photoresist, to form a first via hole, a second via hole, a third via hole and a fourth via hole that penetrate the inter-layer-medium layer 29, the second grid insulating layer 28 and the first grid insulating layer 24, wherein the first via hole and the second via hole expose the first conductorized region 224 or the second conductorized region of the first active layer 22, and the third via hole and the fourth via hole expose the third conductorized region of the second active layer 23.

After the first via hole, the second via hole, the third via hole and the fourth via hole have been formed, a first source 31, a first drain 32, a second source 33 and a second drain 34 are formed on the inter-layer-medium layer 29 by using a one-step patterning process. The first source 31 is connected to the first active layer 22 by the first via hole; particularly, it is connected to the first conductorized region 224 or the second conductorized region of the first active layer 22. The first drain 32 is connected to the first active layer 22 by the second via hole; particularly, it is connected to the first conductorized region 224 or the second conductorized region of the first active layer 22. The second source 33 is connected to the second active layer 23 by the third via hole; particularly, it is connected to the third conductorized region of the second active layer 23. The second drain 34 is connected to the second active layer 23 by the fourth via hole; particularly, it is connected to the third conductorized region of the second active layer 23.

The first source 31 refers to the source of the driver transistor. The first drain 32 refers to the drain of the driver transistor. The second source 33 refers to the source of the switching transistor. The second drain 34 refers to the drain of the switching transistor.

After the first source 31, the first drain 32, the second source 33 and the second drain 34 have been formed, a planarization layer 35 covering the first source 31, the first drain 32, the second source 33, the second drain 34 and the inter-layer-medium layer 29 is formed. The material of the planarization layer 35 is an organic material; for example, the material of the planarization layer 35 is a resin. Furthermore, it is further required to perform exposure and development to the planarization layer 35, to remove the material of the planarization layer within some of the regions, to form a fifth via hole penetrating the planarization layer 35, wherein the fifth via hole exposes the first drain 32.

Subsequently, an anode layer 36 is formed on the planarization layer 35 by using a one-step patterning process, wherein the anode layer 36 is connected to the first drain 32 by the fifth via hole penetrating the planarization layer 35. Finally, a pixel defining layer 37 is formed on the planarization layer 35, wherein the pixel defining layer 37 partially covers the anode layer 36, and the pixel defining layer 37 has a plurality of pixel openings exposing the anode layer 36, to obtain the displaying backplane according to the present embodiment.

In the practical product, the driver transistor comprises the first active layer 22, the first grid 25, the third grid 27, the first source 31 and the first drain 32, and the switching transistor comprises the second active layer 23, the second grid 26, the second source 33 and the second drain 34.

In the embodiment of the present disclosure, by, after the first grid has been formed, performing ion implantation to the first no-channel regions, the second no-channel regions and the second channel region, to occupy the oxygen vacancies of the first no-channel regions, the second no-channel regions and the second channel region, the oxygen-vacancy concentrations of the first no-channel regions, the second no-channel regions and the second channel region are reduced. At this point, the oxygen-vacancy concentration of the first channel region is still relatively high, whereby the carrier mobility of the driver transistor is still relatively high, while the oxygen-vacancy concentration of the second channel region of the switching transistor is reduced, which can reduce the leakage current of the switching transistor, thereby reducing the power consumption of the displaying backplane.

An embodiment of the present disclosure further provides a displaying backplane. The displaying backplane may be obtained by using the method for fabricating a displaying backplane according to the above embodiment. Particularly, the displaying backplane comprises: a substrate base plate 21; a first active layer 22 and a second active layer 23 that are provided on the substrate base plate 21, wherein the materials of the first active layer 22 and the second active layer 23 are an oxide semiconductor, the first active layer 22 has a first channel region 221 and first no-channel regions 222 that are located on the two sides of the first channel region 221, and the second active layer 23 has a second channel region 231 and second no-channel regions 232 that are located on the two sides of the second channel region 231; a first grid insulating layer 24 covering the first active layer 22 and the second active layer 23; and a first grid 25 and a second grid 26 that are provided on the first grid insulating layer 24, wherein the orthographic projection of the first grid 25 on the first active layer 22 coincides with the first channel region 221, and the orthographic projection of the second grid 26 on the second active layer 23 coincides with the second channel region 231; wherein the oxygen-vacancy concentration of the first channel region 221 is greater than the oxygen-vacancy concentrations of the first no-channel regions 222, the second no-channel regions 232 and the second channel region 231.

Before ion implantation is performed to the first no-channel regions 222 of the first active layer 22 and the second no-channel regions 232 and the second channel region 231 of the second active layer 23, all of the regions of the first active layer 22 and the second active layer 23 have a relatively high oxygen-vacancy concentration. By ion implantation, the oxygen-vacancy concentrations of the first no-channel regions 222, the second no-channel regions 232 and the second channel region 231 are reduced; in other words, the oxygen-vacancy concentration of the first channel region 221 is greater than the oxygen-vacancy concentrations of the first no-channel regions 222, the second no-channel regions 232 and the second channel region 231.

Optionally, the displaying backplane further comprises a third grid 27 covering the first grid 25. In the direction along the length of the first channel region 221, the size of the third grid 27 is greater than or equal to the size of the first grid 25. Furthermore, the third grid 27 and second grid 26 are formed by using the same one patterning process at the same time.

Each of the first no-channel regions 222 comprises a lightly doped region 223 and a first conductorized region 224, and the first conductorized region 224 is located on the one side of the lightly doped region 223 that is further away from the first channel region 221; or, the first no-channel regions 222 are a second conductorized region; and the second no-channel regions 232 are a third conductorized region.

After the third grid 27 and the second grid 26 have been formed, conductorization treatment may be performed to the first active layer 22 at the region not covered by the third grid 27 and the second active layer 23 at the second no-channel regions 232. In the direction along the length of the first channel region 221, when the size of the third grid 27 is greater than the size of the first grid 25, each of the first no-channel regions 222 is delimited into a lightly doped region 223 and a first conductorized region 224, and the first conductorized region 224 is located on the one side of the lightly doped region 223 that is further away from the first channel region 221; or, in the direction along the length of the first channel region 221, when the size of the third grid 27 is equal to the size of the first grid 25, the first no-channel regions 222 are a second conductorized region. Furthermore, the second no-channel regions 232 are a third conductorized region.

Figure 8B:
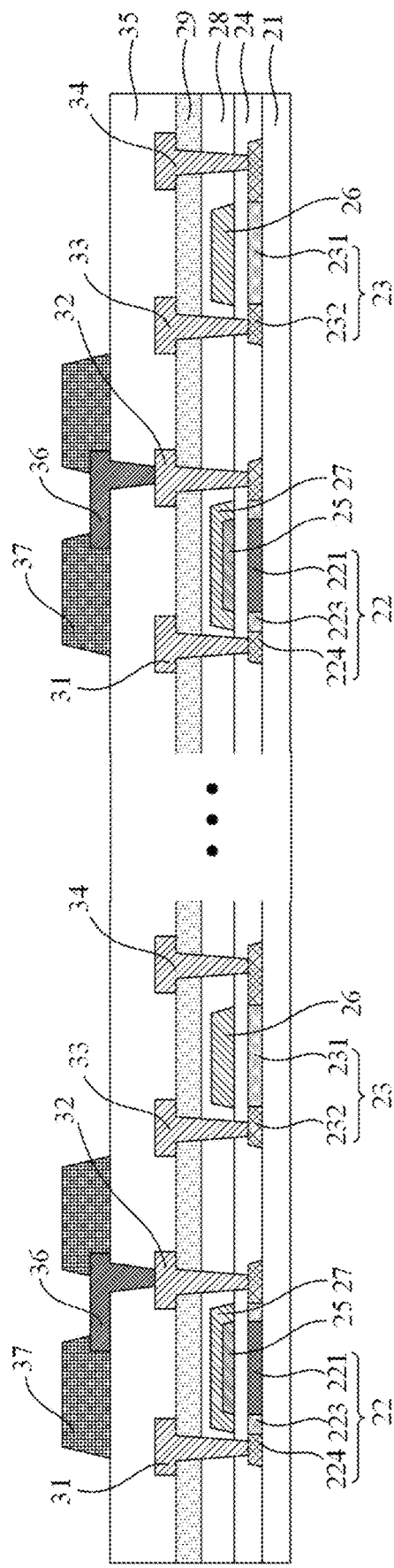
FIG. 8B shows a schematic structural diagram of a plurality of structures shown in FIG. 8A.

Optionally, as shown in FIGS. 8A and 11, the displaying backplane further comprises: a second grid insulating layer 28 covering the second grid 26 and the first grid insulating layer 24; an inter-layer-medium layer 29 provided on the second grid insulating layer 28; a first source 31, a first drain 32, a second source 33 and a second drain 34 that are provided on the inter-layer-medium layer 29, wherein the first source 31 is connected to the first active layer 22 by the first via hole, the first drain 32 is connected to the first active layer 22 by the second via hole, the second source 33 is connected to the second active layer 23 by the third via hole, the second drain 34 is connected to the second active layer 23 by the fourth via hole, and all of the first via hole, the second via hole, the third via hole and the fourth via hole penetrate the inter-layer-medium layer 29, the second grid insulating layer 28 and the first grid insulating layer 24; a planarization layer 35 covering the first source 31, the first drain 32, the second source 33, the second drain 34 and the inter-layer-medium layer 29; an anode layer 36 provided on the planarization layer 35, wherein the anode layer 36 is connected to the first drain 32 by the fifth via hole penetrating the planarization layer 35; and a pixel defining layer 37 provided on the planarization layer 35, wherein the pixel defining layer 37 partially covers the anode layer 36, and the pixel defining layer 37 has a plurality of pixel openings exposing the anode layer 36, as shown in FIG. 8B.

An embodiment of the present disclosure further provides a displaying device, wherein the displaying device comprises the displaying backplane stated above.

Moreover, the displaying device further comprises an organic luminescent layer 55 provided within the pixel openings, and a cathode layer 56 covering the organic luminescent layer 55 and the displaying backplane, and the anode layer, the cathode layer 56 and the organic luminescent layer 55 provided between the anode layer and the cathode layer 56 together form a light emitting device.

Optionally, the displaying device further comprises a packaging layer 57 provided on the cathode layer 56. The packaging layer 57 may be an organic packaging layer, an inorganic packaging layer or a laminated-layer structure of an organic packaging layer and an inorganic packaging layer.

Optionally, the displaying device further comprises components such as a driving chip and a TCON (Timer Control Register).

In practical applications, the displaying device may be any products or components that have the function of displaying, such as a mobile phone, a tablet personal computer, a display, a notebook computer and a navigator.

In the embodiment of the present disclosure, by, after the first grid has been formed, performing ion implantation to the first no-channel regions, the second no-channel regions and the second channel region, to occupy the oxygen vacancies of the first no-channel regions, the second no-channel regions and the second channel region, the oxygen-vacancy concentrations of the first no-channel regions, the second no-channel regions and the second channel region are reduced. At this point, the oxygen-vacancy concentration of the first channel region is still relatively high, whereby the carrier mobility of the driver transistor is still relatively high, while the oxygen-vacancy concentration of the second channel region of the switching transistor is reduced, which can reduce the leakage current of the switching transistor, thereby reducing the power consumption of the displaying backplane.

Regarding the above-described process embodiments, for brevity of the description, all of them are expressed as the combination of a series of actions, but a person skilled in the art should know that the present disclosure is not limited by the sequences of the actions that are described, because, according to the present disclosure, some of the steps may have other sequences or be performed simultaneously. Secondly, a person skilled in the art should also know that all of the embodiments described in the description are preferable embodiments, and not all of the actions and the modules that they involve are required by the present disclosure.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The method for fabricating the displaying backplane, the displaying backplane and the displaying device according to the present disclosure has been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A displaying backplane, wherein the displaying backplane comprises:
   a substrate base plate;
   a first active layer and a second active layer that are provided on the substrate base plate, wherein a material of the first active layer and the second active layer is an oxide semiconductor, the first active layer has a first channel region and first no-channel regions that are located on two sides of the first channel region, and the second active layer has a second channel region and second no-channel regions that are located on two sides of the second channel region;
   a first grid insulating layer covering the first active layer and the second active layer; and
   a first grid and a second grid that are provided on the first grid insulating layer, wherein an orthographic projection of the first grid on the first active layer coincides with the first channel region, and an orthographic projection of the second grid on the second active layer coincides with the second channel region;
   wherein an oxygen-vacancy concentration of the first channel region is greater than oxygen-vacancy concentrations of the first no-channel regions, the second no-channel regions and the second channel region.

2. The displaying backplane according to claim 1, wherein the displaying backplane further comprises a third grid covering the first grid;
   wherein in a direction along a length of the first channel region, a size of the third grid is greater than or equal to a size of the first grid.

3. The displaying backplane according to claim 1, wherein each of the first no-channel regions comprises a lightly doped region and a first conductorized region, and the first conductorized region is located on one side of the lightly doped region that is farther away from the first channel region; or, the first no-channel regions are second conductorized regions; and
   the second no-channel regions are third conductorized regions.

4. The displaying backplane according to claim 1, wherein the displaying backplane further comprises:
   a second grid insulating layer covering the second grid and the first grid insulating layer;
   an inter-layer-medium layer provided on the second grid insulating layer;
   a first source, a first drain, a second source and a second drain that are provided on the inter-layer-medium layer, wherein the first source is connected to the first active layer by a first via hole, the first drain is connected to the first active layer by a second via hole, the second source is connected to the second active layer by a third via hole, the second drain is connected to the second active layer by a fourth via hole, and all of the first via hole, the second via hole, the third via hole and the fourth via hole penetrate the inter-layer-medium layer, the second grid insulating layer and the first grid insulating layer;
   a planarization layer covering the first source, the first drain, the second source, the second drain and the inter-layer-medium layer;
   an anode layer provided on the planarization layer, wherein the anode layer is connected to the first drain by a fifth via hole penetrating the planarization layer; and
   a pixel defining layer provided on the planarization layer, wherein the pixel defining layer partially covers the anode layer, and the pixel defining layer has a plurality of pixel openings exposing the anode layer.

5. A displaying device, wherein the displaying device comprises the displaying backplane according to claim 1.

6. The displaying device according to claim 5, wherein the displaying device further comprises an organic luminescent layer provided within the pixel openings, a cathode layer covering the organic luminescent layer and the displaying backplane, and a packaging layer provided on the cathode layer;
   wherein, the packaging layer is an organic packaging layer, an inorganic packaging layer, or a laminated-layer structure of an organic packaging layer and an inorganic packaging layer.

* * * * *